(12) United States Patent
Tokumaru et al.

(10) Patent No.: US 7,764,211 B2
(45) Date of Patent: Jul. 27, 2010

(54) CURRENT STEERING DAC

(75) Inventors: Michiko Tokumaru, Osaka (JP); Heiji Ikoma, Nara (JP)

(73) Assignee: Panasonic Corporation, Osaka (JP)

( * ) Notice: Subject to any disclaimer, the term of this patent is extended or adjusted under 35 U.S.C. 154(b) by 42 days.

(21) Appl. No.: 12/373,213

(22) PCT Filed: Mar. 13, 2007

(86) PCT No.: PCT/JP2007/054960

§ 371 (c)(1),
(2), (4) Date: Jan. 9, 2009

(87) PCT Pub. No.: WO2008/018196

PCT Pub. Date: Feb. 14, 2008

(65) Prior Publication Data
US 2009/0184855 A1  Jul. 23, 2009

(30) Foreign Application Priority Data
Aug. 7, 2006  (JP) .............................. 2006-214285

(51) Int. Cl.
*H03M 1/66* (2006.01)
(52) U.S. Cl. .................................................... 341/144
(58) Field of Classification Search ......... 341/144–146, 341/118, 120, 135, 136
See application file for complete search history.

(56) References Cited

U.S. PATENT DOCUMENTS

| 5,055,844 | A  |   | 10/1991 | Kasai |  |
|---|---|---|---|---|---|
| 5,410,311 | A  | * | 4/1995  | Doyle ......................... | 341/144 |
| 5,646,619 | A  | * | 7/1997  | Daubert et al. .............. | 341/118 |
| 5,870,044 | A  | * | 2/1999  | Dell'ova et al. ............. | 341/120 |
| 5,870,049 | A  | * | 2/1999  | Huang et al. ................ | 341/144 |
| 6,052,074 | A  |   | 4/2000  | Iida |  |
| 6,265,857 | B1 | * | 7/2001  | Demsky et al. ............. | 323/312 |
| 6,809,673 | B2 | * | 10/2004 | Scanlan et al. ............. | 341/144 |
| 6,924,759 | B2 | * | 8/2005  | Wynne et al. ............... | 341/144 |
| 6,943,760 | B2 | * | 9/2005  | Bae et al. ...................... | 345/76  |
| 7,042,374 | B1 | * | 5/2006  | Manganaro ................. | 341/120 |

FOREIGN PATENT DOCUMENTS

| JP | 5-206860   | 8/1993 |
|---|---|---|
| JP | 2004-080591 | 3/2004 |

\* cited by examiner

*Primary Examiner*—Jean B Jeanglaude
(74) *Attorney, Agent, or Firm*—McDermott Will & Emery LLP

(57) ABSTRACT

In a multi-channel current steering DA converter, e.g., a two-channel current steering DA converter, reference current sources Irefa and Irefb that can serve as current mirror sources for current sources Ia and Ib are provided in current source matrices 2a and 2b of the channels, respectively. During an operation, the reference current source Irefa or Irefb that is provided in the current source matrix of a channel that is not powered down is selected and used in accordance with control signals 6a and 6b. Therefore, even when one channel is powered down, the full-scale current of the other channel can be maintained at a constant value, i.e., unchanged.

20 Claims, 7 Drawing Sheets

(a)

(b)

CURRENT STEERING DAC

RELATED APPLICATIONS

This application is the U.S. National Phase under 35 U.S.C. §371 of International Application No. PCT/JP2007/054960 filed on Mar. 13, 2007, which claims the benefit of Japanese Application No. JP 2006-214285 filed on Aug. 7, 2006, the disclosures of which Applications are incorporated by reference herein.

TECHNICAL FIELD

The present invention relates to a multi-channel current steering DAC in which, when one channel is separately powered down, a constant full-scale current value is obtained in other channels without being affected by the influence.

BACKGROUND ART

At the present time, although microfabrication processes for semiconductor devices have been advanced, the downscaling of processes does not lead to a reduction in area of an analog circuit block as is different from a digital circuit block. Also, since a single LSI has multiple functions, power tends to be increased, so that there is a large demand for a reduction in power consumption.

Conventionally, in a multi-channel current steering DA converter, a bias circuit is often shared by a plurality of channels so as to reduce the area. Also, since the number of required channels varies depending on the operation mode, channels may be individually powered down so as to reduce the power.

An exemplary configuration of the multi-channel current steering DA converter is shown in FIG. 10. FIG. 10 illustrates a two-channel current steering DA converter.

In the multi-channel current steering DA converter (hereinafter a DA converter is abbreviated as a DAC) of FIG. 10, 1a and 1b indicate one-channel DACs, 2a and 2b indicate current source matrices, 3a and 3b indicate decoder+switch units, 4a and 4b indicate digital input signals, 5a and 5b indicate analog output terminals, 7 indicates a bias circuit, Ia and Ib indicate current sources, Iref indicates a reference current source, and I1 indicates a bias current.

The one-channel DACs 1a and 1b have current sources Ia and Ib the numbers of which depend on the number of bits, respectively. The current value of the current sources Ia and Ib is determined based on the bias current I1 and the reference current source Iref. D/A conversion is performed by the decoder+switch units 3a and 3b outputting the currents of the current sources Ia and Ib in amounts corresponding to the digital input signals 4a and 4b to the analog output terminals 5a and 5b, respectively.

The current sources Ia and Ib are arranged in matrices on a substrate. These are the current source matrices 2a and 2b. The reference current source Iref that is a current mirror source for the current sources is also provided in the current source matrix 2a so as to put the reference current source Iref in the same voltage drop and manufacture conditions as those for the current sources.

Thus, the configuration in which a reference current source is provided in a current source matrix is described in Patent Document 1.

Patent Document 1: Japanese Unexamined Patent Application Publication No. H01-277027 (FIG. 1)

DISCLOSURE OF THE INVENTION

Problems to be Solved by the Invention

However, it has been found that, in the conventional multi-channel current steering DAC described above, power consumption differs between when all channels are operating and when only a portion of the channels are operating, so that a voltage drop due to a wiring resistance or the like varies, and therefore, the full-scale current of an operating channel varies. This will be hereinafter described in detail.

FIG. 11(a) shows an influence of wiring resistance of a two-channel current steering DAC. In FIG. 11(a), Ra1 and Rb1 indicate first wiring resistances, Ra2 and Rb2 indicate second wiring resistances, and Rar indicates a third wiring resistance. The layout is assumed to be designed so that Ra1=Rb1 and Ra2=Rb2.

Voltage drops Via and Vib to the current sources Ia and Ib are calculated by:

$$Via=(IFS+Iref)*Ra1+Ia*Ra2$$

$$Vib=IFS*Rb1+Ib*Rb2$$

where the full-scale current of the DAC is represented by IFS (the current of the current source Ia, Ib×n (n is the number of the current sources Ia, Ib)).

When the full-scale current IFS of the DAC is sufficiently large with respect to the current Iref of the reference current source (IFS>>Iref), $$Via \approx Vib.$$

Also, as shown in FIG. 11(b), assuming that the reference current source Iref is M (M is a natural number) times as large as the current source Ia and is provided in the same current source matrix 2a in which the current source Ia is provided, a voltage drop Viref to the reference current source Iref is represented by:

$$Viref = (IFS + Iref)*Ra1 + Iref*Rar$$
$$= (IFS + Iref)*Ra1 + (Ia*M)*(Ra2/M)$$
$$= (IFS + Iref)*Ra1 + Ia*Ra2.$$

Thus, the voltage drop Viref is equal to the voltage drop Via, Vib to the current source Ia, Ib.

However, when the one-channel DAC 1a including the reference current source Iref is powered down, a current flowing through a wiring line to the current source matrix 2a in which the reference current source Iref is provided is reduced, so that the voltage drop Viref to the reference current source Iref becomes:

$$Viref=Iref*Ra1+Ia*Ra2.$$

Since IFS>>Iref, $$Viref<<Vib.$$

Therefore, the source voltage of the reference current source Iref and the source voltage of the current source Ib are different from each other, and as a result, the full-scale current value of the one-channel DAC 1b varies between when the one-channel DAC 1a in which the reference current source Iref is provided is operating and when the one-channel DAC 1a is not operating.

As described above, in the conventional multi-channel current steering DA converter, when one channel is powered down, the full-scale currents of other channels change.

An object of the present invention is to provide a multi-channel current steering DA converter in which even when any of the channels is powered down, the other channels invariably hold their full-scale currents at a predetermined constant value.

Solution to the Problems

To achieve the above-described object, the present invention provides a multi-channel current steering DA converter in which a reference current source that can serve as a current mirror source for a current source is provided in each of two or more of the current source matrices of a plurality of channels, and a reference current source that is provided in the current source matrix of one that is not powered down of the plurality of reference current sources is selected and used.

A multi-channel current steering DA converter according to the present invention includes a plurality of channels each including a one-channel current steering DA unit having a current source matrix. The converter has a bias circuit shared by the plurality of one-channel DA units. A reference current source for determining a current value of a plurality of current sources included in the current source matrix of a channel is provided in the current source matrix of each of two or more of the plurality of channels. One of the two or more reference current sources provided is selected and used in accordance with a control signal.

A multi-channel current steering DA converter according to the present invention includes a plurality of channels each including a one-channel current steering DA unit having a current source matrix. The converter has a bias circuit shared by the plurality of one-channel DA units. A reference current source for determining a current value of a plurality of current sources included in the current source matrix of a channel is provided in the current source matrix of each of two or more of the plurality of channels. Predetermined two or more of the two or more reference current sources provided are selected and used in accordance with a control signal.

In the multi-channel current steering DA converter of the present invention, the control signal is a signal that is changed, depending on powered-down states of the channels.

In the multi-channel current steering DA converter of the present invention, the plurality of current sources included in the current source matrix of each channel and the reference current source form a current mirror.

In the multi-channel current steering DA converter of the present invention, each of the reference current sources has a switch connected in series between the each of the reference current sources and the bias circuit. One or more to be used of the plurality of reference current sources are selected by opening or closing the switch of each of the reference current sources.

In the multi-channel current steering DA converter of the present invention, each of the reference current sources includes a transistor. One or more to be used of the plurality of reference current sources are selected by switching gate voltages of the transistors to switch OFF one or more not to be used of the plurality of reference current sources.

In the multi-channel current steering DA converter of the present invention, the plurality of current sources included in the current source matrix of each channel and the plurality of reference current sources each have a cascode transistor. One or more to be used of the plurality of reference current sources are selected by switching gate voltages of the cascode transistors to switch OFF one or more not to be used of the plurality of reference current sources.

In the multi-channel current steering DA converter of the present invention, the plurality of reference current sources each invariably generate an independent bias voltage using the bias circuit. One or more to be used of the plurality of reference current sources are selected by selecting whether to supply each of the bias voltages individually generated by the plurality of reference current sources to the plurality of current sources included in the current source matrix of any of the channels.

A semiconductor integrated circuit according to the present invention includes the multi-channel current steering DA converter.

A video apparatus according to the present invention includes the semiconductor integrated circuit.

A communication apparatus according to the present invention includes the semiconductor integrated circuit.

Thus, the present invention provides a multi-channel current steering DA converter in which a plurality of reference current sources are provided, and one that is provided in an operating current source matrix of the reference current sources is selected and used. Therefore, even when any of the channels is powered down, the full-scale currents of the other channels can be maintained at a predetermined constant value.

Particularly, in the present invention, two or more reference current sources can be selected and used during an operation, so that, for example, when the reception intensity of a received digital signal is high, the gain of an analog output can be changed and reduced to ½ as compared to when a single reference current source is selected and used. In addition, manufacture variations in a reference current source to be selected are averaged, thereby making it possible to further maintain the full-scale current of each channel at a constant value.

EFFECT OF THE INVENTION

As described above, according to the present invention, in a multi-channel current steering DAC, even when one channel is powered down, an increase in full-scale current can be reliably prevented in the other channels, so that the full-scale current of each channel can be maintained at a predetermined constant value irrespective of the operation mode.

Figure 1:
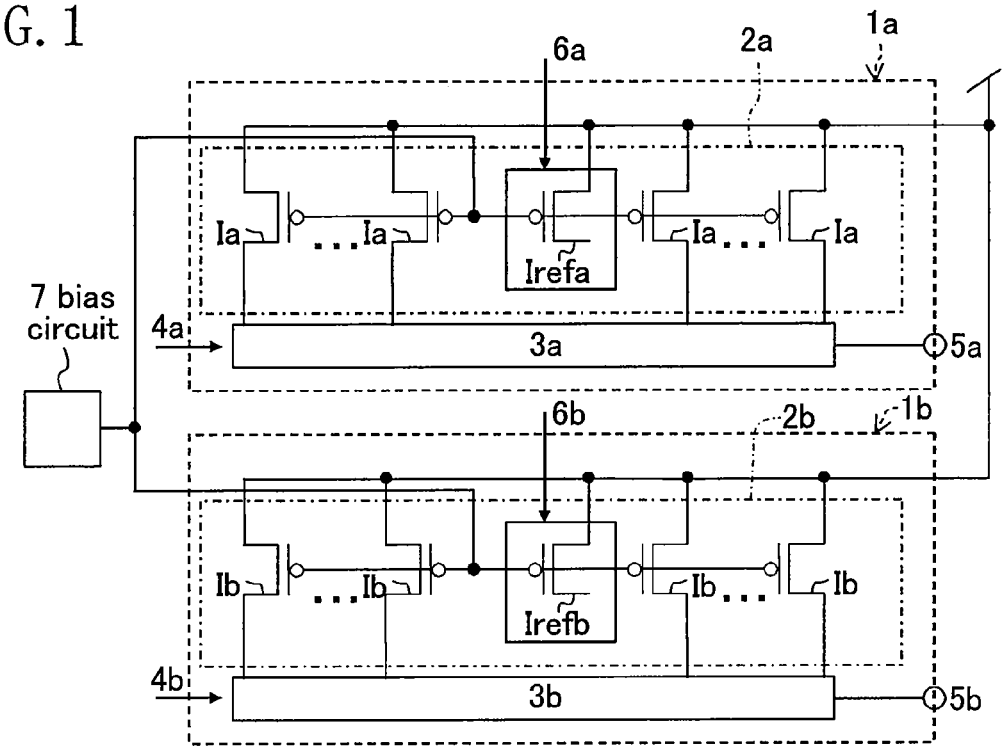
FIG. 1 is a diagram showing a configuration of a multi-channel current steering DAC according to Embodiment 1 of the present invention.

DESCRIPTION OF THE REFERENCE CHARACTERS 1a, 1b one-channel DAC
  (one-channel DA unit)
2a, 2b current source matrix
3a, 3b decoder+switch unit
4a, 4b digital input signal
5a, 5b analog output terminal
6a, 6b control signal
7 bias circuit
8, 8a, 8b bias voltage
9 cascode voltage
Ia, Ib current source
I1, I1a, I1b bias current
Iref, Irefa, Irefb reference current source
Ra1, Ra2, Rar, Rb1, Rb2, Rar wiring resistance
Sa, Sb switch
Pa, Pb first cascode transistor
Prefa, Prefb second cascode transistor
20 DVD apparatus (video apparatus)
25 wireless LAN apparatus (communication apparatus)
A, B multi-channel current steering DA converter of the present invention

BEST MODE FOR CARRYING OUT THE INVENTION

Hereinafter, embodiments of the present invention will be described with reference to the accompanying drawings.

Embodiment 1

FIG. 1 shows a configuration of a multi-channel current steering DA converter (hereinafter a DA converter is abbreviated as a DAC) according to Embodiment 1 of the present invention. The DAC is integrated into a predetermined semiconductor integrated circuit.

In FIG. 1, 1a and 1b indicate one-channel DACs (one-channel DA units), 2a and 2b indicate current source matrices, 3a and 3b indicate decoder+switch units, 4a and 4b indicate digital input signals, 5a and 5b indicate analog output terminals, 6a and 6b indicate control signals, 7 indicates a bias circuit, Ia and Ib indicate current sources, and Irefa and Irefb indicate reference current sources.

The one-channel DACs 1a and 1b have the current sources Ia and Ib, the reference current sources Irefa and Irefb, and the decoder+switch units 3a and 3b, respectively, the numbers of which depend on the number of bits. The current value of the current sources Ia and Ib is determined by the bias circuit 7 and the reference current sources Irefa and Irefb, respectively. D/A conversion is performed by the decoder+switch units 3a and 3b outputting the current sources Ia and Ib to the analog output terminals 5a and 5b in amounts depending on the digital input signals 4a and 4b, respectively.

Also, the current sources Ia and Ib are arranged in matrices on a substrate. These are the current source matrices 2a and 2b. The reference current sources Irefa and Irefb that are current mirror sources of the current sources Ia and Ib are provided in the current source matrices 2a and 2b, respectively, so as to put the reference current sources Irefa and Irefb in the same voltage drop and manufacture conditions as those for the current sources Ia and Ib, respectively.

Moreover, the reference current sources Irefa and Irefb are switched ON/OFF in accordance with the control signals 6a and 6b, respectively.

Thus, the configuration of the current steering DAC of Embodiment 1 of the present invention has been described. Next, an operation of Embodiment 1 will be described.

When both the one-channel DACs 1a and 1b are in the operation state, the reference current sources Irefa and Irefb are controlled in accordance with the control signals 6a and 6b so that one of them is switched ON while the other is switched OFF. Also, when the one-channel DAC 1a is switched OFF, the reference current source Irefa is switched OFF while the reference current source Irefb is switched ON. Moreover, when the one-channel DAC 1b is switched OFF, the reference current source Irefa is switched ON while the reference current source Irefb is switched OFF.

Figure 2:
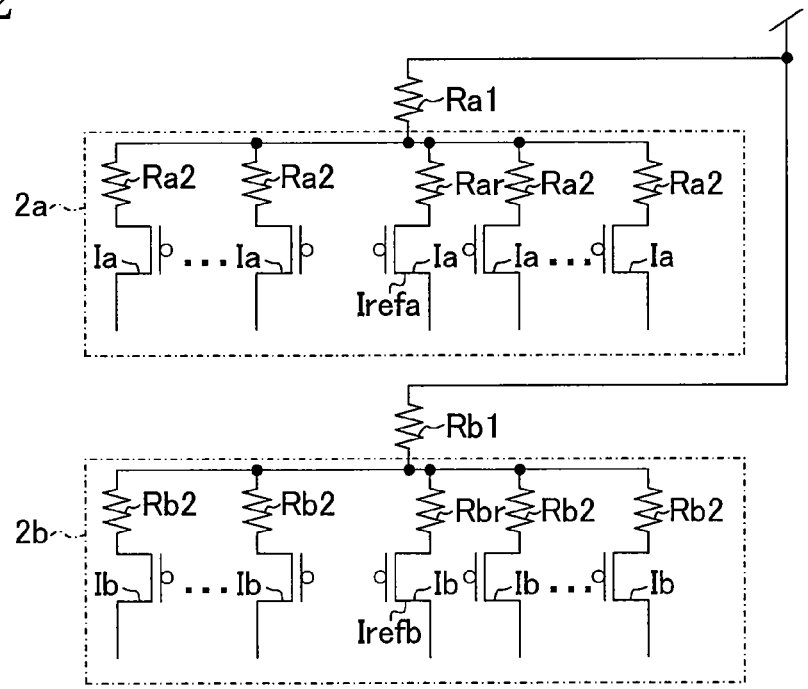
FIG. 2 is a diagram showing wiring resistances in a current source matrix of Embodiment 1 of the present invention.

Influences of the wiring resistances of the current source matrices 2a and 2b are shown in FIG. 2. In FIG. 2, Ra1 and Rb1 indicate first wiring resistances, Ra2 and Rb2 indicate second wiring resistances, and Rar and Rbr indicate third wiring resistances. The layout is designed so that Ra1=Rb1 and Ra2=Rb2.

When both the one-channel DACs 1a and 1b are in the operation state, voltage drops Via and Vib to the current sources Ia and Ib are equal to voltage drops Virefa and Virefb to the reference current sources Irefa and Irefb, respectively, no matter whether the reference current source Irefa or Irefb is ON, as described relating to the conventional art.

Also, it is assumed that the one-channel DAC 1a including the reference current source Irefa is powered down and the one-channel DAC b is operating. When the reference current source Irefa is also powered down and the reference current source Irefb is selected and used, the voltage drop Vib to the current source 1b and the voltage drop Virefb to the Irefb are:

$$Vib=(IFS+Irefb)*Rb1+Ib*Rb2$$

$$Virefb=(IFS+Irefb)*Rb1+Ib*Rb2.$$

Thus, $$Vib \approx Virefb.$$

Therefore, a deviation of a current value due to a voltage drop can be eliminated.

Thus, the reference current sources Irefa and Irefb are switched, depending on the operation modes of the one-channel DACs 1a and 1b, so that the reference current source Irefa or Irefb of the operating current source matrix can be invariably used, thereby making it possible to obtain a constant full-scale current irrespective of the operation mode.

Also, by switching ON both the reference current sources Irefa and Irefb, the gain of an analog output can be changed to ½. This is effective since the gain can be reduced to ½ if, for example, the reception intensity of a digital signal is high.

Moreover, when both the reference current sources Irefa and Irefb are ON, then if a current supplied from the bias circuit 7 is caused to be two times as large as that when only one of the reference current sources is ON, the full-scale current of the other channel can be maintained at a constant value without changing the gain or switching the reference current sources. In this case, since the reference current sources are not selectively switched, there is not a change in full-scale current due to an influence of manufacture variations in each reference current source, so that the effect of reducing variations is obtained.

Note that the number of channels of a current steering DAC may be two or more. By selectively switching ON and using the reference current source Iref of an operating channel, a similar effect is obtained. Alternatively, a plurality of reference current sources may be provided in a current source matrix of one channel, and one of the reference current sources that has small manufacture variations between each channel may be selected, thereby making it possible to reduce an influence of variations in manufacture process.

With a configuration as described above, the full-scale current of a current steering DAC can be caused to be constant irrespective of the operation mode.

Embodiment 2

Figure 3:
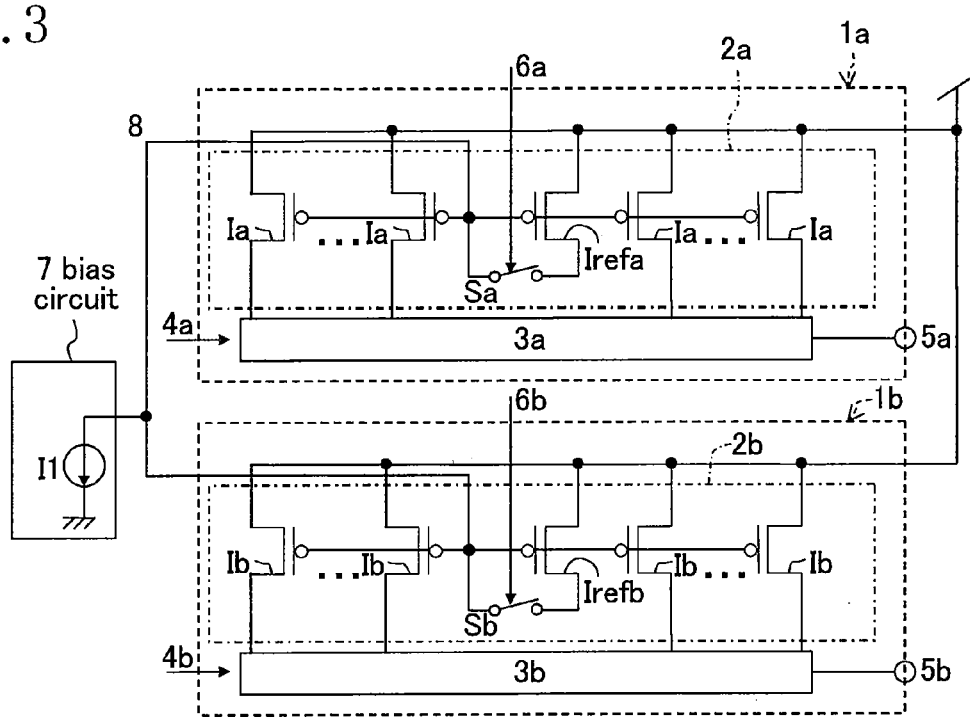
FIG. 3 is a diagram showing a configuration of a multi-channel current steering DAC according to Embodiment 2 of the present invention.

FIG. 3 shows an exemplary configuration of a current steering DAC according to Embodiment 2 of the present invention.

In FIG. 3, 8 indicates a bias voltage, I1 indicates a bias current, and Sa and Sb indicate switches.

One-channel DACs 1a and 1b have current sources Ia and Ib, reference current sources Irefa and Irefb, and decoder+switch units 3a and 3b, respectively, the numbers of which depend on the number of bits. The current value of the current sources Ia and Ib is determined based on the bias current I1 and the reference current sources Irefa and Irefb, respectively.

D/A conversion is performed by the decoder+switch units 3a and 3b outputting the current sources Ia and Ib to analog output terminals 5a and Sb in amounts depending on digital input signals 4a and 4b, respectively.

Also, the current sources Ia and Ib are arranged in matrices on a substrate. These are the current source matrices 2a and 2b. The reference current sources Irefa and Irefb that are current mirror sources of the current sources Ia and Ib are also provided in the current source matrices 2a and 2b, respectively, so as to put the reference current sources Irefa and Irefb in the same voltage drop and manufacture conditions as those for the current sources Ia and Ib, respectively.

The current sources Ia and Ib and the reference current sources Irefa and Irefb in the one-channel DACs 1a and 1b each include a P-ch transistor. The sources of the current sources Ia and Ib are connected to a power supply voltage, the gates thereof are connected to the bias voltage 8, and the drains thereof are connected via the decoder+switch units 3a and 3b to the analog output terminals 5a and Sb, respectively. The power supply voltage is applied to the sources of the reference current sources Irefa and Irefb, the bias voltage 8 is applied to the gates thereof, and the drains thereof are connected via the switches Sa and Sb, respectively, to a bias circuit 7, through which the bias current I1 flows. The switches Sa and Sb are switched ON/OFF in accordance with the control signals 6a and 6b, respectively. When the switch Sa is switched ON, the bias current I1 flows into the reference current source Irefa. When the switch Sb is switched ON, the bias current I1 flows into the reference current source Irefb, so that the bias voltage 8 is determined. The bias voltage 8 is input to the gates of the current sources Ia and Ib of the one-channel DACs 1a and 1b, so that a predetermined multiple of a current is caused to flow from the current sources Ia and Ib.

Thus, the configuration of the current steering DAC of Embodiment 2 of the present invention has been described. Next, an operation of Embodiment 2 of the present invention will be described.

When both the one-channel DACs 1a and 1b are operating, the switches Sa and Sb are controlled in accordance with the control signals 6a and 6b, respectively, so that one of the reference current sources Irefa and Irefb is switched ON while the other is switched OFF. For example, when the switch Sa is switched ON, a current flows into the reference current source Irefa, so that the reference current source Irefa operates as a reference current source for the current sources Ia and Ib. On the other hand, when the switch Sb is switched OFF, the drain of the reference current source Irefb is open, so that a current does not flow and the reference current source Irefb does not operate.

Also, when the one-channel DAC 1a is powered down, the switch Sa is switched OFF while the switch Sb is switched ON. Moreover, when the one-channel DAC 1b is powered down, the switch Sa is switched ON while the switch Sb is switched OFF.

Thus, by invariably using the reference current source Irefa, Irefb of the one-channel DAC 1a, 1b that is operating, voltage drops to the current sources Ia and Ib and voltage drops to the reference current sources Irefa and Irefb are caused to be equal to each other, respectively, so that a constant full-scale current can be obtained irrespective of the operation mode.

Also, by switching ON both the switches Sa and Sb, the gain of an analog output can be changed to ½. Moreover, as described above, by changing the value of the bias current I1, depending on the number of switches to be switched ON, the effect of reducing variations is obtained without changing the gain. When both the switches Sa and Sb are switched ON, the bias current I1 may be caused to be two times as large as that when only one of the switches is switched ON.

Note that the number of channels of a current steering DAC may be two or more. By switching ON and using the reference current source Iref in an operating channel, a similar effect is obtained.

With a configuration as described above, the full-scale current of a current steering DAC can be caused to be constant irrespective of the operation mode.

Embodiment 3

Figure 4:
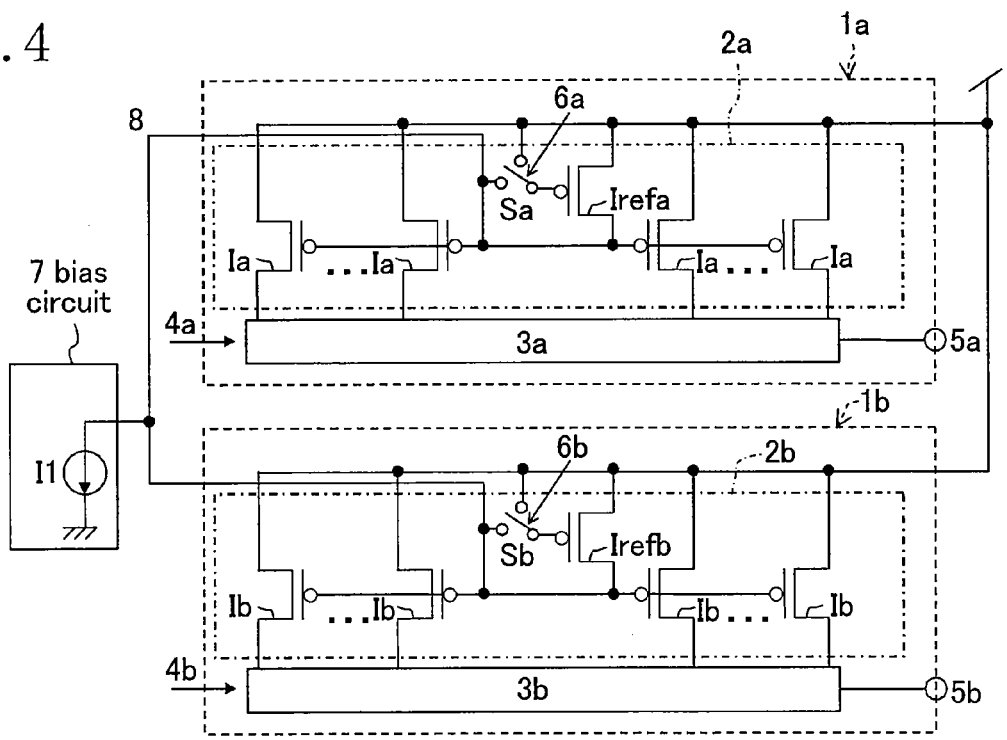
FIG. 4 is a diagram showing a configuration of a multi-channel current steering DAC according to Embodiment 3 of the present invention.

FIG. 4 shows an exemplary configuration of a current steering DAC according to Embodiment 3 of the present invention.

One-channel DACs 1a and 1b have current sources Ia and Ib, reference current sources Irefa and Irefb, and decoder+switch units 3a and 3b, respectively, the numbers of which depend on the number of bits. The current value of the current sources Ia and Ib is determined based on the bias current I1 and the reference current sources Irefa and Irefb, respectively.

D/A conversion is performed by the decoder+switch units 3a and 3b outputting the current sources Ia and Ib to the analog output terminals 5a and 5b in amounts depending on the digital input signals 4a and 4b, respectively.

Also, the current sources Ia and Ib are arranged in matrices on a substrate. These are the current source matrices 2a and 2b. The reference current sources Irefa and Irefb that are current mirror sources of the current sources Ia and Ib are also provided in the current source matrices 2a and 2b, respectively, so as to put the reference current sources Irefa and Irefb in the same voltage drop and manufacture conditions as those for the current sources Ia and Ib, respectively.

The current sources Ia and Ib and the reference current sources Irefa and Irefb in the one-channel DACs 1a and 1b each include a P-ch transistor. A power supply voltage is applied to the sources of the reference current sources Irefa and Irefb, the bias current I1 flows through the drains thereof, and the gates thereof are connected via the switches Sa and Sb, respectively, to the bias voltage 8 or the power supply voltage. The switches Sa and Sb can be switched ON/OFF in accordance with the control signals 6a and 6b, respectively.

Thus, the configuration of the current steering DAC of Embodiment 3 of the present invention has been described. Next, an operation of Embodiment 3 of the present invention will be described.

When both the one-channel DACs 1a and 1b are ON, the switches Sa and Sb are controlled in accordance with the control signals 6a and 6b, respectively, so that one of the reference current sources Irefa and Irefb is switched ON while the other is switched OFF. For example, when the switch Sa is connected to the bias voltage 8 side, a current flows into the reference current source Irefa, which then operates as a reference current source for the current sources Ia and Ib. On the other hand, the switch Sb is connected to the power supply voltage side, so that a current does not flows into the reference current source Irefb, which therefore does not operate. Also, when the one-channel DAC 1a is powered down, the switch Sa is connected to the power supply voltage side while the switch Sb is connected to the bias voltage 8 side. Moreover, when the one-channel DAC 1b is powered down, the switch Sa is connected to the bias voltage 8 side while the switch Sb is connected to the power supply voltage side.

Also, as described above, by connecting both the switches Sa and Sb to the bias voltage 8 side, the gain of an analog output can be changed to ½. Moreover, by changing the value of the bias current I1, depending on the number of switches to be switched ON, the effect of reducing variations is obtained without changing the gain. When both the switches Sa and Sb are switched ON, the bias current I1 may be caused to be two times as large as that when only one of the switches is switched ON.

Thus, by invariably using a reference current source in a one-channel DAC that is operating, a voltage drop to each current source and a voltage drop to a reference current source are caused to be equal to each other, so that a constant full-scale current can be obtained irrespective of the operation mode.

Note that the number of channels of a current steering DAC may be two or more. By selectively switching ON and using the reference current source Iref in an operating channel, a similar effect is obtained.

With a configuration as described above, the full-scale current of a current steering DAC can be caused to be constant irrespective of the operation mode.

Embodiment 4

Figure 5:
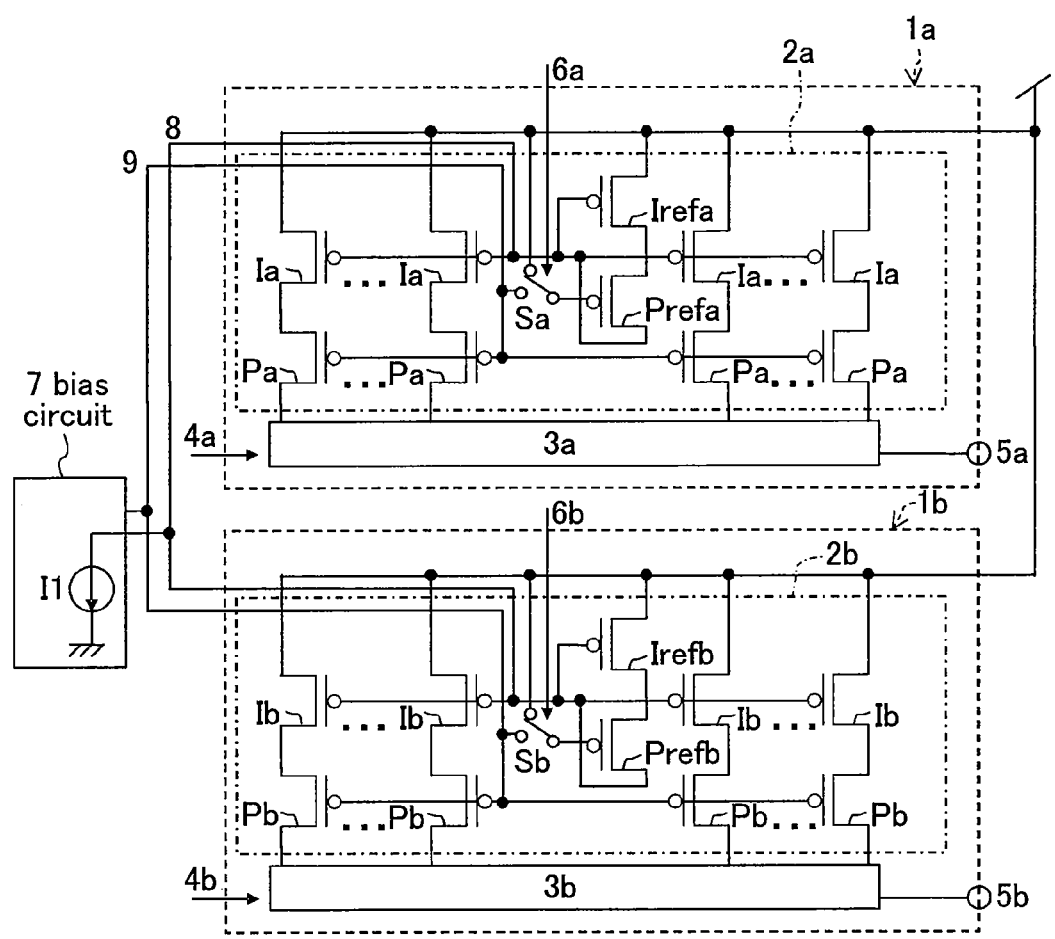
FIG. 5 is a diagram showing a configuration of a multi-channel current steering DAC according to Embodiment 4 of the present invention.

FIG. 5 shows an exemplary configuration of a current steering DAC according to Embodiment 4 of the present invention. In this embodiment, a cascode transistor is provided to increase an output resistance, thereby further maintaining the full-scale current at a constant value.

In FIG. 5, Pa and Pb indicate first cascode transistors, Prefa and Prefb indicate second cascode transistors, and 9 indicates a cascode voltage for causing the first and second cascode transistors Pa, Pb, Prefa and Prefb to perform an ON operation. Current sources Ia and Ib, reference current sources Irefa and Irefb, the first cascode transistors Pa and Pb, and the second cascode transistors Prefa and Prefb each include a P-ch transistor. In the current sources Ia and Ib, a power supply voltage is applied to the sources thereof, the bias voltage 8 is applied to the gates thereof, and the drains thereof are connected to the sources of the first cascode transistors Pa and Pb, respectively. Also, in the reference current sources Irefa and Irefb, the power supply voltage is applied to the sources thereof, the bias voltage 8 is applied to the gates thereof, and the drains thereof are connected to the sources of the second cascode transistors Prefa and Prefb, respectively. Moreover, the drains of the first cascode transistors Pa and Pb are connected to decoder+switch units 3a and 3b, respectively, and the cascode voltage 9 is applied to the gates thereof. In the second cascode transistors Prefa and Prefb, the bias current I1 flows through the drains thereof, and one of the cascode voltage 9 and the power supply voltage is selectively applied to the gates via the switches Sa and Sb in accordance with control signals 6a and 6b, respectively.

Thus, the configuration of the multi-channel current steering DAC of Embodiment 4 of the present invention has been described. Next, an operation of Embodiment 4 will be described.

When both the two one-channel DACs 1a and 1b are operating, the switches Sa and Sb are controlled in accordance with the control signals 6a and 6b, respectively, so that one of the reference current sources Irefa and Irefb is switched ON while the other is switched OFF. For example, when the switch Sa is connected to the cascode voltage 9 side, the second cascode transistor Prefa is switched ON, so that a current flows into the reference current source Irefa, which then operates as a reference current source for the current sources Ia and Ib. On the other hand, the switch Sb is connected to the power supply voltage side, so that the second cascode transistor Prefb is switched OFF, and therefore, a current does not flow into the reference current source Irefb, which therefore does not operate. Also, when the one-channel DAC 1a is powered down, the switch Sa is connected to the power supply voltage side while the switch Sb is connected to the cascode voltage 9 side. Moreover, when the one-channel DAC 1b is powered down, the switch Sa is connected to the cascode voltage 9 side while the switch Sb is connected to the power supply voltage side.

Thus, by invariably using a reference current source in a one-channel DAC that is operating, voltage drops to the current sources Ia and Ib and voltage drops to the reference current sources Irefa and Irefb are caused to be equal to each other, respectively, so that a constant full-scale current can be obtained irrespective of the operation mode.

Also, by connecting both the switches Sa and Sb to the cascode voltage 9, the gain of an analog output can be changed to ½. Moreover, by changing the value of the bias current I1, depending on the number of switches to be switched ON, the effect of reducing variations is obtained without changing the gain. When both the switches Sa and Sb are switched ON, the bias current I1 may be caused to be two times as large as that when only one of the switches is switched ON.

Note that the number of channels of a multi-channel current steering DAC may be two or more. By selectively switching ON and using the reference current source Iref of an operating channel, a similar effect is obtained.

With a configuration as described above, the full-scale current of a multi-channel current steering DAC can be caused to be constant irrespective of the operation mode.

Embodiment 5

Figure 6:
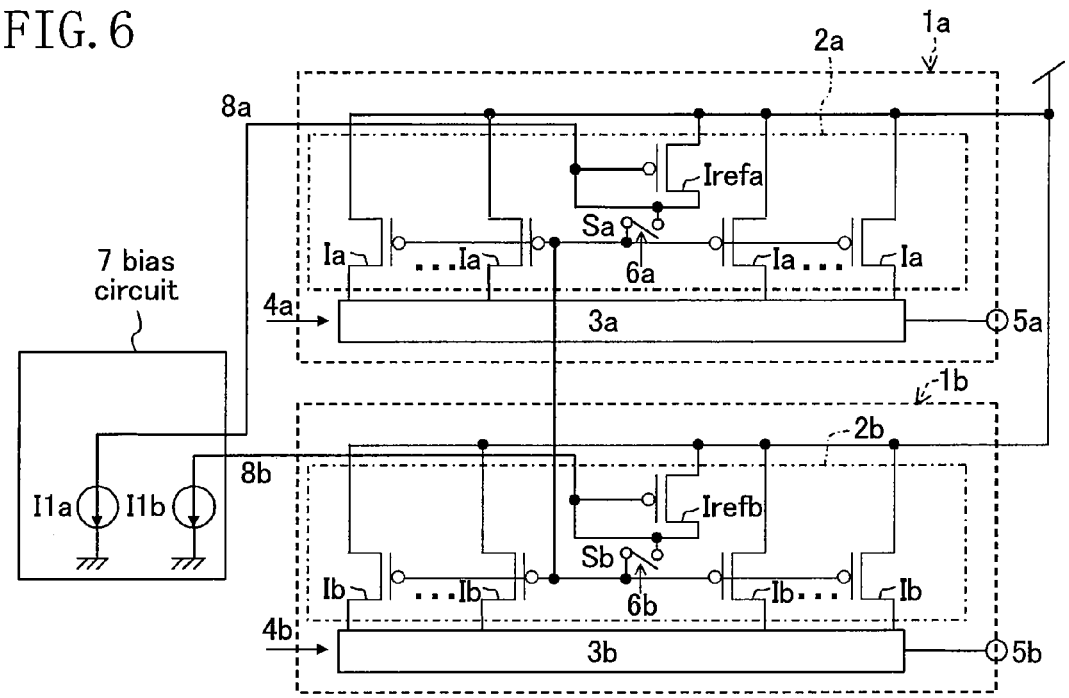
FIG. 6 is a diagram showing a configuration of a multi-channel current steering DAC according to Embodiment 5 of the present invention.

FIG. 6 shows a configuration of a multi-channel current steering DAC according to Embodiment 5 of the present invention.

In FIG. 6, current sources Ia and Ib and reference current sources Irefa and Irefb each include a P-ch transistor. A bias circuit 7 has two bias current sources I1a and I1b have the same capacitance, which are connected to the drains of the reference current sources Irefa and Irefb, respectively.

The bias currents of the bias current sources I1a and I1b flow into the reference current sources Irefa and Irefb, respectively, so that independent and dedicated bias voltages 8a and 8b invariably occur at the gates of the reference current sources Irefa and Irefb, respectively. A power supply voltage is applied to the sources of the current sources Ia and Ib, the drains thereof are connected to decoder+switch units 3a and 3b, respectively, and the gates thereof are selectively connected to one of the bias voltages 8a and 8b by the switches Sa and Sb in accordance with the control signals 6a and 6b, respectively.

Thus, the configuration of the multi-channel current steering DAC of Embodiment 5 of the present invention has been described. Next, an operation of Embodiment 5 will be described.

When both the two one-channel DACs 1a and 1b are operating, the switches Sa and Sb are controlled in accordance with the control signals 6a and 6b, respectively, so that the gates of the current sources Ia and Ib are connected to one of the bias voltages 8a and 8b generated by the reference current sources Irefa and Irefb, respectively. For example, when the switch Sa is switched ON, the reference current source Irefa operates as a reference current source for the current sources Ia and Ib. On the other hand, the switch Sb is switched OFF. Also, when the one-channel DAC 1a is powered down, the switch Sa is switched OFF while the switch Sb is switched ON. Moreover, when the one-channel DAC 1b is powered down, the switch Sa is switched ON while the switch Sb is switched OFF.

Also, by switching ON both the switches Sa and Sb, the effect of reducing variations is obtained as described above.

Thus, by invariably using a reference current source in a one-channel DAC that is operating, voltage drops to the current sources Ia and Ib and voltage drops to the reference current sources are caused to be equal to each other, respectively, so that a full-scale current having a constant value can be obtained irrespective of the operation mode.

Particularly, in this embodiment, two bias voltages 8a and 8b are independently and stably supplied. Therefore, rising can be sped up when reference current sources to be used are switched and changed.

Note that the number of channels of a multi-channel current steering DAC may be two or more. In any case, by using a bias voltage generated by a reference current source in an operating channel, a similar effect is obtained.

Figure 7:
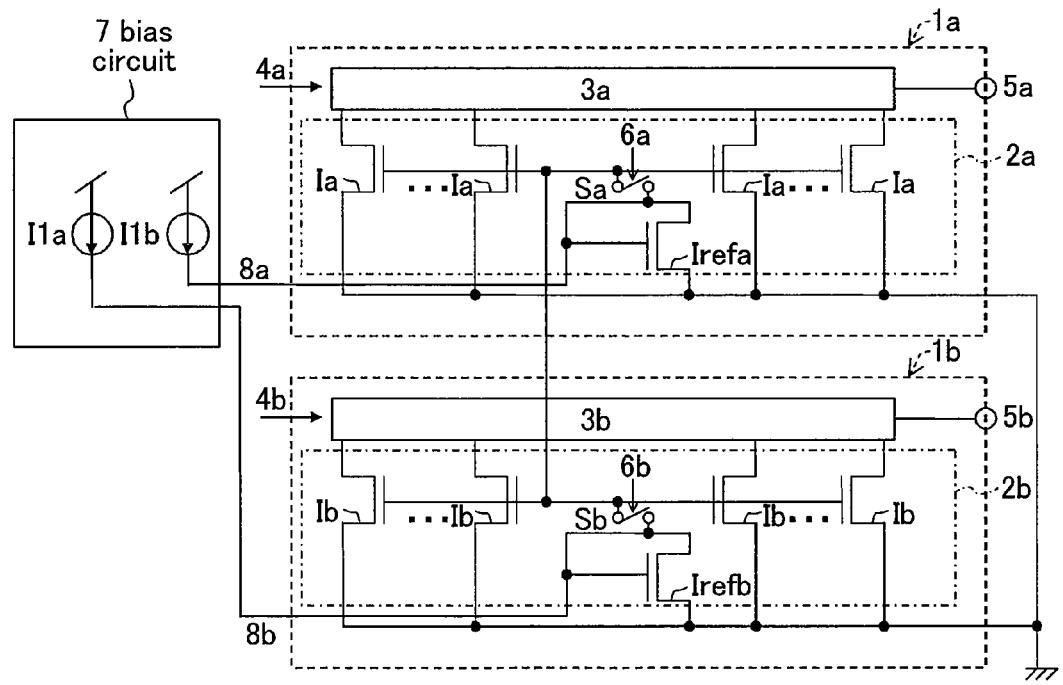
FIG. 7 is a circuit diagram showing the multi-channel current steering DAC of FIG. 6 that includes N-ch transistors.

In this embodiment, the current sources Ia and Ib and the reference current sources Irefa and Irefb each include a P-ch transistor, or alternatively, may each include an N-ch transistor. An exemplary circuit in this case will be shown in FIG. 7. The multi-channel current steering DA converters of FIGS. 3 to 5 in which an N-ch transistor is employed can be easily contemplated according to the configuration of FIG. 7. Note that, in the DA converter of FIG. 5, the first cascode transistors Pa and Pb and the second cascode transistors Prefa and Prefb also each include an N-ch transistor. The switches Sa and Sb connect the gates of the second cascode transistors Prefa and Prefb, respectively, to the cascode voltage 9 or a ground voltage.

Application Example

Figure 8:
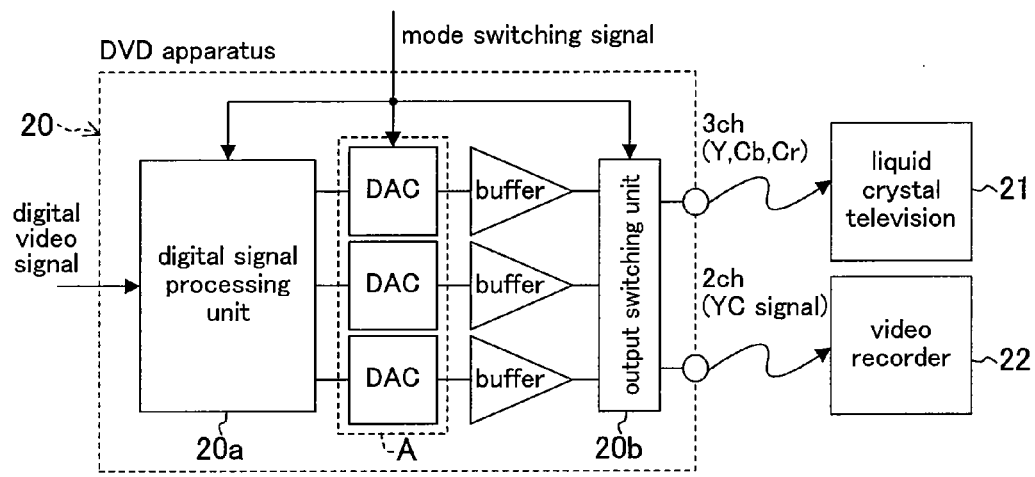
FIG. 8 is an exemplary configuration of a video apparatus comprising the multi-channel current steering DAC of the present invention.

FIG. 8 shows an exemplary configuration of a video apparatus comprising any one of the multi-channel current steering DA converters of Embodiments 1 to 5 described above. In the video apparatus (DVD apparatus 20) of FIG. 8, a three-channel current steering DA converter A of the present invention is provided, and an output switching unit 20b is used to switch outputs of the three-channel current steering DA converter A, i.e., digital signals processed by a digital signal processing unit 20a are output, via the three-channel current steering DA converter A, as a three-channel output (e.g., a component terminal or a D terminal is used) to a liquid crystal television 21, or as a two-channel output (e.g., an S terminal or the like is used) to a video recorder 22. In the three-channel current steering DA converter A, when a two-channel output is selected, a predetermined one channel is powered down.

Figure 9:
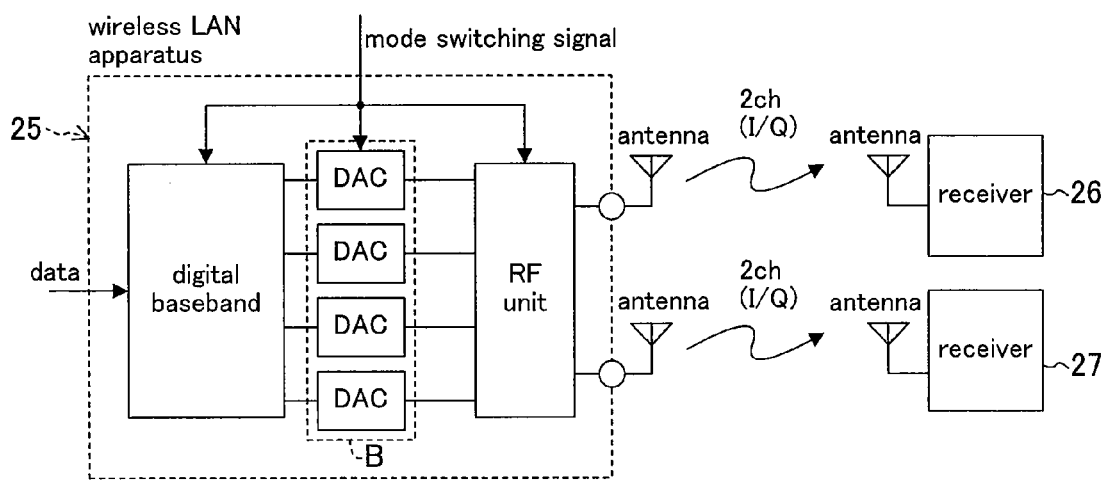
FIG. 9 is an exemplary configuration of a communication apparatus comprising the multi-channel current steering DAC of the present invention.
Figure 10:
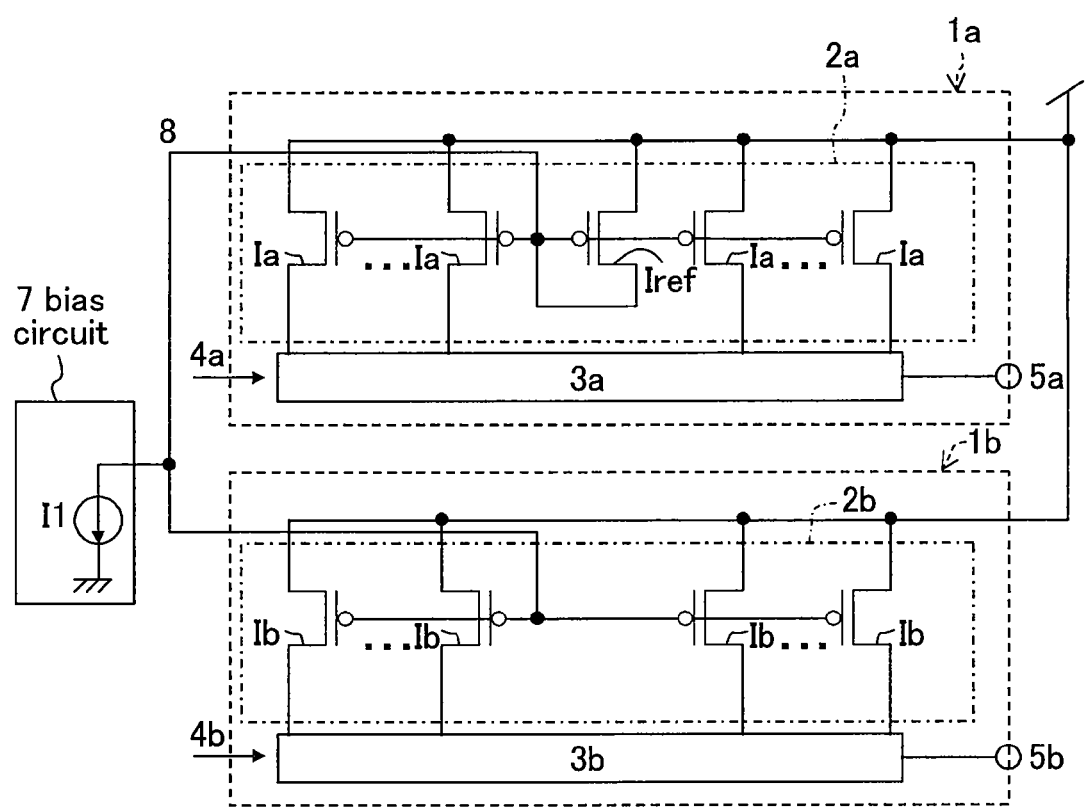
FIG. 10 is a diagram showing a configuration of a conventional multi-channel current steering DAC.
Figure 11:
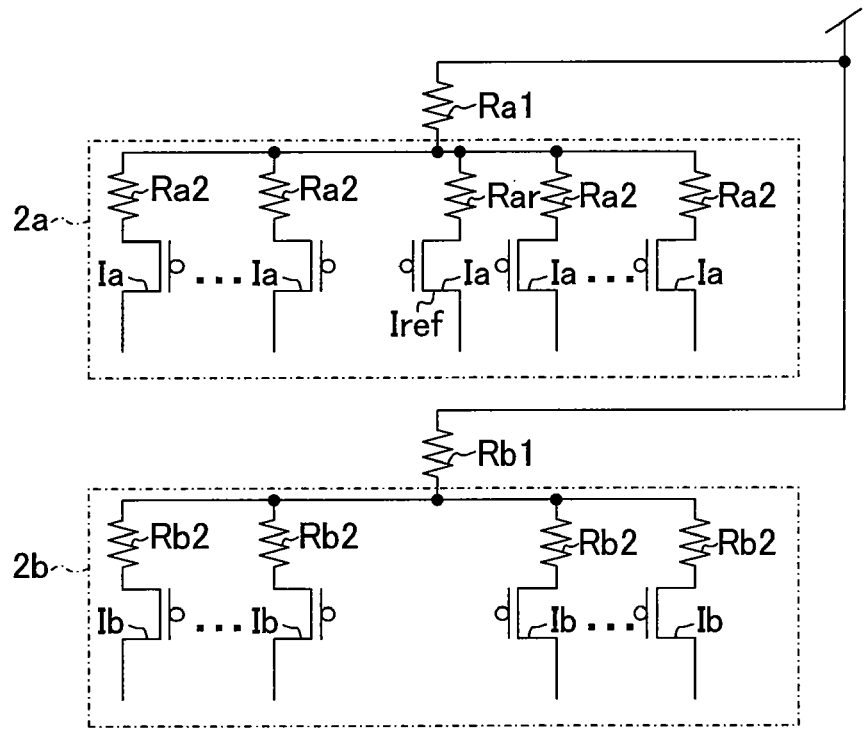
FIG. 11(a) is a diagram showing wiring resistances in a conventional current source matrix.
FIG. 11(b) is a diagram showing a wiring resistance in a reference current source of a conventional current source matrix.
Figure 11:
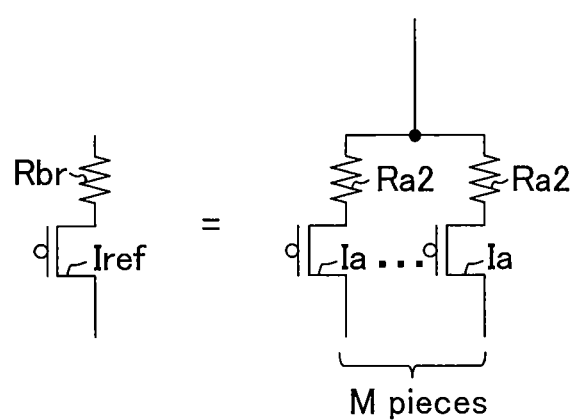

FIG. 9 shows an exemplary configuration of a communication apparatus comprising any one of the multi-channel current steering DA converters of Embodiments 1 to 5. In the communication apparatus (wireless LAN apparatus 25) of FIG. 9, a four-channel current steering DA converter B of the present invention is provided. The wireless LAN apparatus 25 of FIG. 9 includes two transmission systems each of which transmits a two-channel signal including an I signal and a Q signal. The two two-channel signals are transmitted via respective antennas to two reception units 26 and 27, respectively. In the four-channel current steering DA converter B, when only one system performs signal transmission, two of the four channels are powered down.

INDUSTRIAL APPLICABILITY

As described above, the present invention provides a multi-channel current steering DA converter in which a reference current source is provided in each of a plurality of channels, and one or two or more of the reference current sources are selected by switching. Therefore, even when an unnecessary channel is powered down, a full-scale current having a predetermined constant value can be obtained in the other channels. Therefore, the present invention is preferably applied to a multi-channel video apparatus and a communication apparatus.

The invention claimed is:

1. A multi-channel current steering DA converter comprising a plurality of channels each including a one-channel current steering DA unit having a current source matrix, wherein
the converter has a bias circuit shared by the plurality of one-channel DA units,
a reference current source for determining a current value of a plurality of current sources included in the current source matrix of a channel is provided in the current source matrix of each of two or more of the plurality of channels, and
one of the two or more reference current sources provided is selected and used in accordance with a control signal.

2. A multi-channel current steering DA converter comprising a plurality of channels each including a one-channel current steering DA unit having a current source matrix, wherein
the converter has a bias circuit shared by the plurality of one-channel DA units, a reference current source for determining a current value of a plurality of current sources included in the current source matrix of a channel is provided in the current source matrix of each of two or more of the plurality of channels, and predetermined two or more of the two or more reference current sources provided are selected and used in accordance with a control signal.

3. The multi-channel current steering DA converter of claim 1, wherein the control signal is a signal that is changed, depending on powered-down states of the channels.

4. The multi-channel current steering DA converter of claim 1, wherein the plurality of current sources included in the current source matrix of each channel and the reference current source form a current mirror.

5. The multi-channel current steering DA converter of claim 4, wherein each of the reference current sources has a switch connected in series between the each of the reference current sources and the bias circuit, and one or more to be used of the plurality of reference current sources are selected by opening or closing the switch of each of the reference current sources.

6. The multi-channel current steering DA converter of claim 4, wherein each of the reference current sources includes a transistor, one or more to be used of the plurality of reference current sources are selected by switching gate voltages of the transistors to switch OFF one or more not to be used of the plurality of reference current sources.

7. The multi-channel current steering DA converter of claim 4, wherein the plurality of current sources included in the current source matrix of each channel and the plurality of reference current sources each have a cascode transistor, and one or more to be used of the plurality of reference current sources are selected by switching gate voltages of the cascode transistors to switch OFF one or more not to be used of the plurality of reference current sources.

8. The multi-channel current steering DA converter of claim 4, wherein the plurality of reference current sources each invariably generate an independent bias voltage using the bias circuit, and one or more to be used of the plurality of reference current sources are selected by selecting whether to supply each of the bias voltages individually generated by the plurality of reference current sources to the plurality of current sources included in the current source matrix of any of the channels.

9. A semiconductor integrated circuit comprising the multi-channel current steering DA converter of claim 1.

10. A video apparatus comprising the semiconductor integrated circuit of claim 9.

11. A communication apparatus comprising the semiconductor integrated circuit of claim 9.

12. The multi-channel current steering DA converter of claim 2, wherein the control signal is a signal that is changed, depending on powered down states of channels.

13. The multi-channel current steering DA converter of claim 2, wherein the plurality of current sources include in the current source matrix of each channel and the reference source form a current mirror.

14. The multi-channel current steering DA converter of claim 13, wherein each of the reference current source has a switch connected in series between the each of the reference current source and the bias circuit, and one or more to be used of the plurality of reference current sources are selected by opening or closing the switch of each of the reference current sources.

15. The multi-channel current steering DA converter of claim 13, wherein each of the reference current sources includes a transistor, one or more to be used of the plurality of reference current sources are selected by switching gate voltages of the transistors to switch OFF one or more not to be used of the plurality of reference current sources.

16. The multi-channel current steering DA converter of claim 13, wherein the plurality of current sources included in the current source matrix of each channel and the plurality of reference current sources each have a cascode transistor, and one or more to be used of the plurality of reference current sources are selected by switching gate voltages of the cascode transistors to switch OFF one or more not to be used of the plurality of reference current sources.

17. The multi-channel current steering DA converter of claim 13, wherein the plurality of reference current sources each invariably generate an independent bias voltage using the bias circuit, and one or more to be used of the plurality of reference current sources are selected by selecting whether to supply each of the bias voltages individually generated by the plurality of reference current sources to the plurality of current sources included in the current source matrix of any of the channels.

18. A semiconductor integrated circuit comprising the multi-channel current steering DA converter of claim 2.

19. A video apparatus comprising the semiconductor integrated circuit of claim 18.

20. A communication apparatus comprising the semiconductor integrated circuit of claim 18.

* * * * *